United States Patent [19]

Pelc

[11] 4,315,167
[45] Feb. 9, 1982

[54] SELF-SWITCHING BIDIRECTIONAL DIGITAL LINE DRIVER

[75] Inventor: Rafael Pelc, Rochester, Minn.

[73] Assignee: International Business Machines Corporation, Armonk, N.Y.

[21] Appl. No.: 73,590

[22] Filed: Sep. 10, 1979

[51] Int. Cl.³ .................. H03K 17/56; H03K 3/01
[52] U.S. Cl. .................. 307/241; 307/270; 307/445; 307/443
[58] Field of Search ............ 307/270, 215, DIG. 3, 307/412, 241, 445, 443; 425/5

[56] References Cited

U.S. PATENT DOCUMENTS 3,769,525  10/1973  Foss et al. .................. 307/241
4,196,363   4/1980  Malaviya .................. 307/DIG. 3

OTHER PUBLICATIONS

IBM Tech. Disclre. Bttn, Bipolar Transmission Line Driver, by R. O. Hippert, vol. 11, No. 12, 4/66, pp. 1765 & 1766.
IBM Tech. Disclre. Bttn, Bit Driver by D. P. Repchick, vol. 10, No. 2, 7/67, pp. 186 & 187.

*Primary Examiner*—Stanley D. Miller, Jr.
*Assistant Examiner*—B. P. Davis
*Attorney, Agent, or Firm*—J. Michael Anglin

[57] ABSTRACT

A logic driver circuit repowers signals in either direction along a line, without requiring any external direction-control signal. Two back-to-back driver halves each include a gate, an open-collector transmitter and a latch. The latch is connected to the gate and transmitter to prevent race conditions.

5 Claims, 4 Drawing Figures

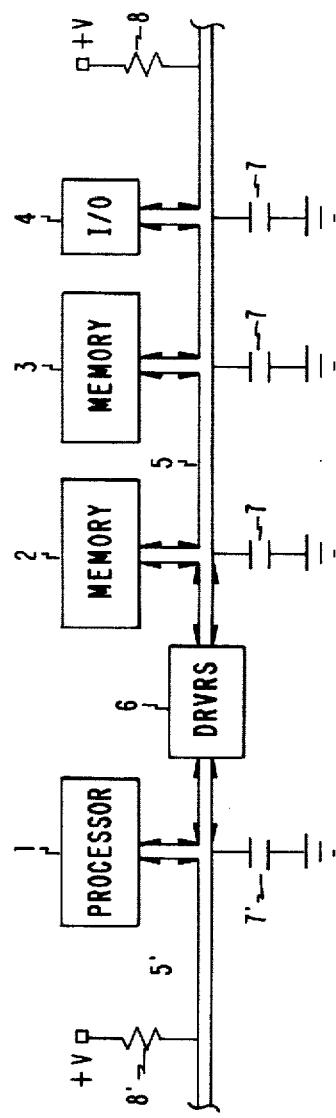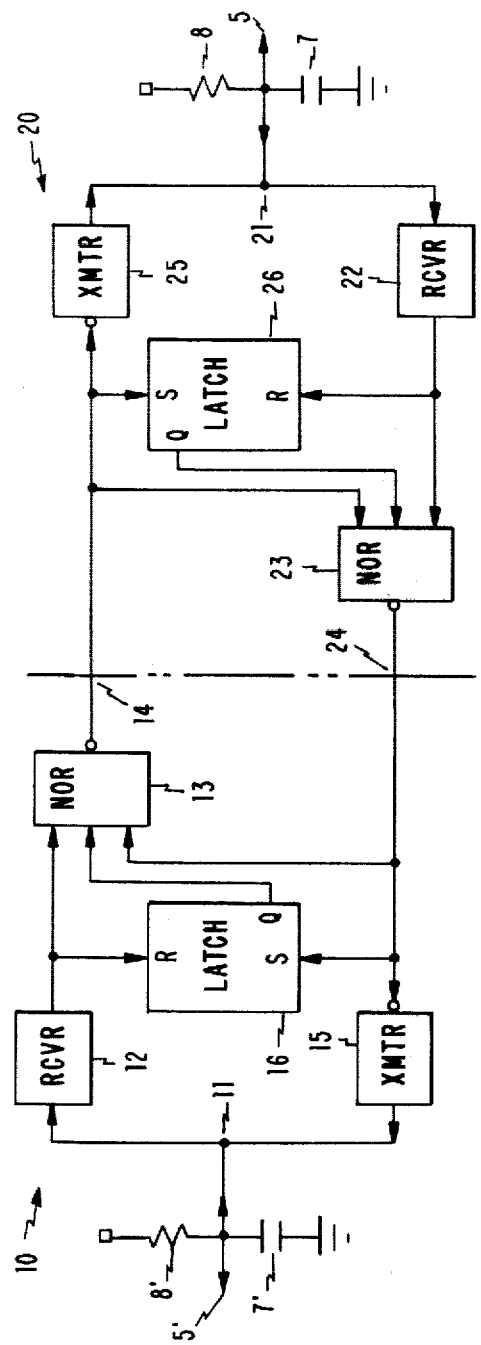
FIG. 1
FIG. 2

SELF-SWITCHING BIDIRECTIONAL DIGITAL LINE DRIVER

BACKGROUND

The present invention relates to digital logic circuits, and particularly concerns a driver for repowering digital signals traveling in either direction along an electrical line.

Many digital-logic systems require drivers, buffers or amplifiers to repower signals on long or heavily-loaded lines. Frequently, as in bus-oriented memory or microprocessor systems, at least some of the lines carry signals in either direction at different times. Conventional bidirectional line drivers employ an external control signal to switch between two sets of unidirectional drivers connected in a back-to-back fashion; but some systems may not produce such a signal, or the difficulty and time delay in producing such a signal may be unacceptable. There are drivers which switch direction automatically, by sensing their own input-output (I/O) nodes, such as the circuit described by D. J. Johnston, "Redriver for Two-Way Bus", IBM Technical Disclosure Bulletin, August 1975, pages 663, 664. Conventional circuits of this type are inherently dependent upon circuit delays for proper operation. Some conditions of external circuit loading, or of manufacturing process variations, implementation technology, etc. can unintentionally vary the delay parameters so that a "glitch" (a spurious pulse) is produced on one of the I/O lines, and is then propagated to other circuits. The exact manner in which this fault occurs is described more fully below.

SUMMARY OF THE INVENTION

The present logic driver circuit is an improvement to the aforementioned Johnston circuit in that it provides positive self-switching in a bidirectional driver, and removes the dependency upon circuit delay times for proper operation. Therefore, the present circuit is glitch-free under all allowed loading conditions, and can be manufactured in various technologies and processes without regard for differing delay parameters. At the same time, it is simple and inexpensive.

These advantages are achieved in a circuit having a pair of driver halves each including a latch as well as a gate and a drive amplifier. The latch is connected to the gates in such a manner that race conditions are avoided when the external I/O signals switch between levels.

The above and other advantages, as well as modifications within the skill of the art, will become apparent in the following description of a preferred embodiment.

DRAWING

FIG. 1 shows an illustrative environment for the present invention.

FIG. 2 is a logic diagram of a driver according to the invention.

DETAILED DESCRIPTION

Figure 3:
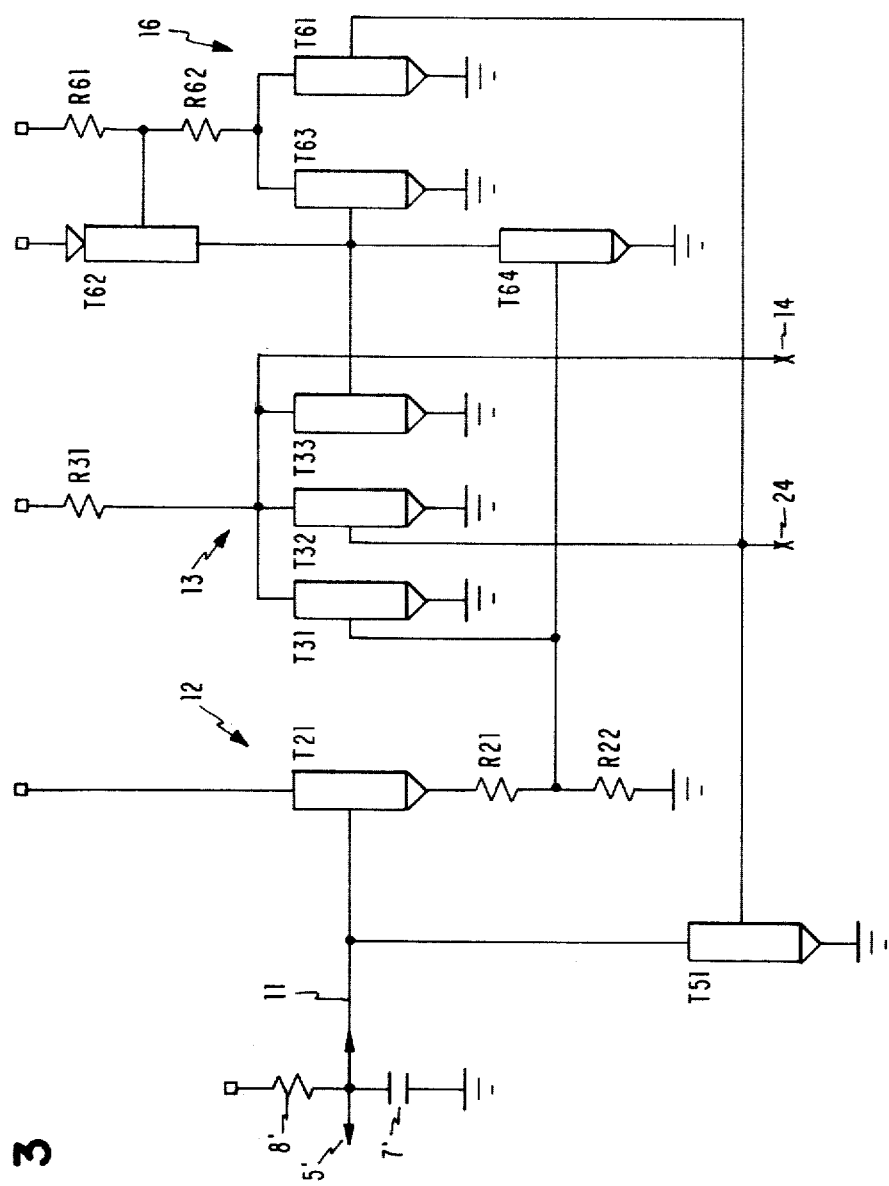
FIG. 3 is a circuit schematic of one implementation of a driver half according to FIG. 2.

FIG. 1 illustrates a typical environment in which the present invention is useful. An integrated-circuit microprocessor 1 communicates with memory modules 2, 3 and with input/output ports 4 by means of a bus 5. Some or all of the individual lines of this bus may be bidirectional.

Driver module 6 powers up the signals from processor 1 to provide the input current required for charging the capacitance of the inputs of modules 2-4 and of bus 5 itself (represented schematically as lumped capacitors 7). Driver 6 also receives signals on bus 5 from modules 2-4 and transmits these signals in an opposite direction on bus portion 5' to processor 1, without any requirement for externally switching the driver circuits to function in the reverse direction. Capacitor 7' represents the distributed capacitance of bus portion 5'. Resistances 8 and 8' are conventional pull-up resistors coupled between each bus line and a fixed supply voltage +Vcc.

FIG. 2 represents the logic functions of a driver module 6 for a sample bus line. Multiple drivers may be packaged together in accordance with conventional practices. Module 6 may be described in terms of two identical halves 10 and 20. Driver half 10 communicates with bus 5' through an external bidirectional node 11, which may be a physical pin in an integrated-circuit package. Receiver 12 provides any level-shifting, shaping, or other function which may be required to provide a signal in proper form for the remainder of the circuit. Receiver 12 accepts input signals from bus 5' and is coupled to one input of a NOR gate 13, represented in FIG. 2 as an OR function followed by an inversion (circle) at internal output node 14. Another input of NOR 13 comes from an internal input noder 24, which is also an internal output node of driver half 20. Transmitter circuit 15 inverts and repowers or amplifies the signal at node 24 for transmission along bus 5'. Transmitter 15 has an open-collector or analogous form of output capable of actively pulling node 11 to one signal level; at other times, node 11 is passively released, so that external resistor 8 pulls it toward the opposite level. The output (Q) of latch 16 is set (S) when internal node 24 goes high, and is rest (R) by receiver 12 when external node 11 goes high; this output provides a third input to NOR 13. Reference numerals 21-26 denote points in driver half 20 which respectively correspond to those denoted by numerals 11-16 in half 10; 14 is another internal node at the output of NOR 13.

Driver halves 10 and 20 are connected to each other at their internal nodes 14 and 24, so that the output of each becomes the input of the other. Thus, although the external nodes 11 and 21 are bidirectional, internal nodes 14 and 24 carry signals in a single direction only.

FIG. 3 shows details of one driver half 10 embodied in a particular technology using bipolar transistors. To avoid cluttering the diagram, small squares denote connections to a common positive supply voltage. External resistor 8' and capacitance 7' are also included in FIG. 3. Receiver transistor T21 and resistors R21, R22 level-shift incoming signals from external node 11; other functions may also be provided, or receiver 12 might in some cases not be required at all. NOR-gate transistors T31-T33 have common collectors and load resistance R31 coupled to internal node 14. Driver 15 is a single high-current transistor T51 having its collector tied to node 11 and its base coupled to node 24. Thus, when node 24 goes high, T51 conducts, actively pulling node 11 toward ground. The low internal resistance of T51 discharges capacitance 7' relatively quickly. When node 24 goes low, T51 ceases to conduct, thereby releasing node 11 from ground. Node 11 is pulled up to the supply-voltage level by external resistor 8'. Since resistance 8' will normally be much greater than the saturation resistance of T51, the time required to charge capacitance 7' to the supply voltage will exceed the discharge time to ground. Finally, latch 16 receives a Set pulse at the base of T61, which turns on T62 via R61 and R62, which latches the output at the T62/T64 collectors high by turning on T63. This excitation circle is broken by a reset pulse to the base of T64, which turns off T63. Other specific set/reset latch circuits could be substituted for this particular design.

Figure 4:
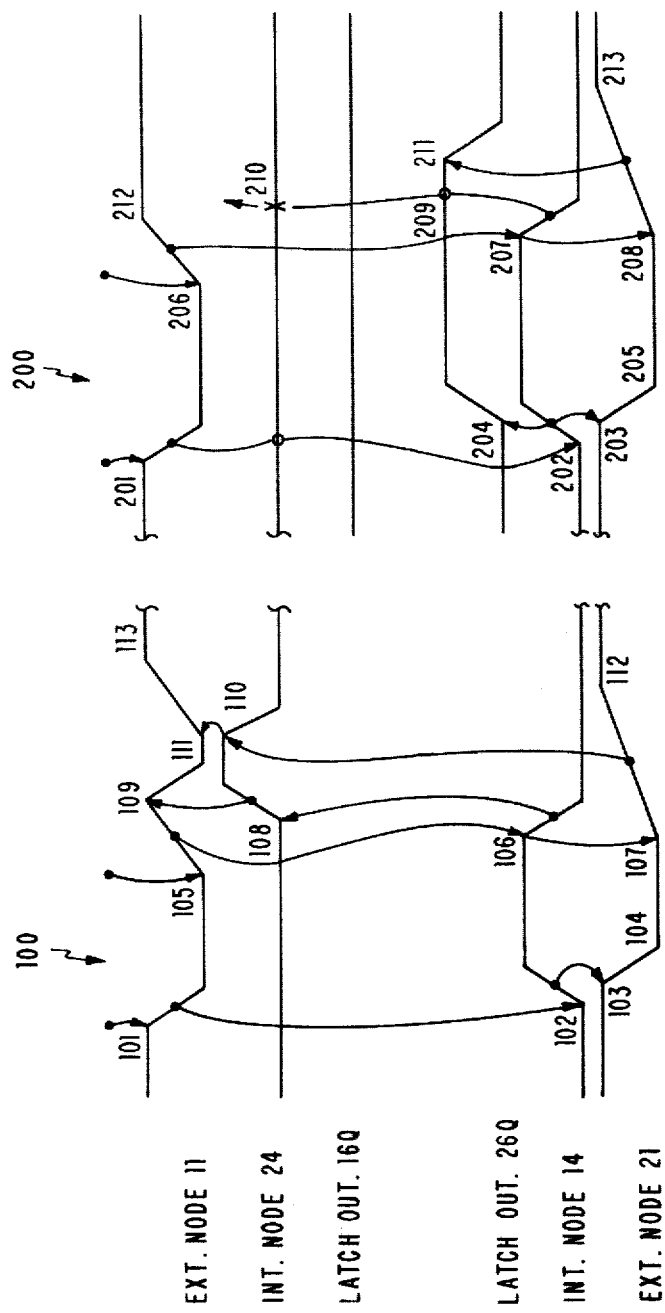
FIG. 4 shows waveforms produced by the driver of FIG. 2.

In FIG. 4, waveforms 100 show the action of driver module 6 with latches 16 and 26 disconnected, so as to point out the precise manner in which race conditions or glitches can arise in prior-art drivers of this type. Assume that external node 11 is initially stable at a high level. Then internal nodes 14 and 24 are low, and external node 21 is high. If an external source then inputs a low level on bus line 5', node 11 is pulled down at point 101. After a short propagation delay, node 14 rises at 102, which in turn pulls node 21 low at 103. By time 104, the output on bus 5 is in the same state as input node 5'. But, when an input signal on bus 5' attempts to pull node 11 high, as at 105, the large bus capacitance 7 and resistor 8 slow the rise toward the high logic level. At a certain threshold, node 14 begins to switch downward at 106, and node 21 begins to rise at 107. Since these transitions may occur more rapidly, node 14 is able to switch node 24 on at 108, forcing external node 11 to return toward a low level at 109. This condition persists until the rising level of node 21, slowed by external capacitance 7, can turn off node 24 at 110 and again force node 11 toward a high level at 111. Ultimately, output external node 21 reaches a stable high level at 112, and driver external node 11 becomes stable at 113. Thus, an externally perceptible glitch appears on node 11 (and therefore on bus 5') between points 105 and 109. The magnitude and duration of this unwanted signal depends both upon the manufacturing parameters of the driver itself and upon its loading in the particular system in which it is used.

Waveforms 200 of FIG. 4 show a similar signal sequence with the latches 16 and 26 reconnected into driver 6 of FIG. 2. Again, an external input signal into node 11 switches node 11 downward at 201. Since node 24 is off, node 14 switches on at 202, and external node 21 begins to fall at 203. Further, output Q of latch 26 begins to rise at 204. At point 205, nodes 11 and 21 are both stable. Then, an up-level input signal into node 11 at 206 switches nodes 14 and 21 at 207 and 208. This time, however, the Set state of latch 26 at point 29 prevents node 24 from changing at 210. Later, at 211, the rising value of node 21 resets latch 26. Thus, external node 11 rises smoothly to a stable high level at 212, followed by node 21 at 213. Although nodes 14 and 21 are switched by the same signal from node 11 at 206, node 21 always operates at a higher power level and capacitance than does node 14. Although this effect causes a glitch in waveforms 100, the same effect is employed advantageously in waveforms 200 to prevent this glitch, since latch 26 cannot be reset before its state is sensed by node 14 at point 209.

Having thus described my invention, what I claim as new, and desire to secure by Letters Patent is:

1. A self-switching bidirectional logic driver, comprising a pair of coupled driver halves, each including:
a gate coupled to an external bidirectional input/output node and to an internal input node, said gate having an output coupled to an internal output node;
a latch having a first input coupled to said external bidirectional input/output node and a second input coupled to said internal input node, said latch having an output coupled to said gate; and
a transmitter coupled to said external node and to said internal input node, said transmitter being adapted to drive said external node to a first logic level and to release said external node toward a second logic level,
said pair of driver halves being coupled to each other by connecting the internal input node of each of said driver halves to the internal output node of the other of said driver halves.

2. A driver according to claim 1, wherein the internal output node of each of said pair of driver halves is connected to the internal input node of the other of said pair of driver halves.

3. A driver according to claim 2, wherein said transmitter comprises an open-collector transistor adapted to conduct between said external node and a constant potential and having a control electrode connected to said internal input node.

4. A driver according to claim 2, wherein said gate is a NOR gate adapted to produce a first logic level in response to any input signal at a second logic level.

5. A driver according to claim 2, wherein each of said pair of driver halves further includes a receiver connected between said external node and said gate, said receiver being adapted to provide an acceptable signal to said gate.

* * * * *